(12) United States Patent
Wan

(10) Patent No.: US 12,229,419 B2
(45) Date of Patent: Feb. 18, 2025

(54) PAGE BUFFER SUPPORTING DIFFERENT BIT LINE FORCING OPERATIONS USING A DYNAMIC LATCH

(71) Applicant: YANGTZE MEMORY TECHNOLOGIES CO., LTD., Wuhan (CN)

(72) Inventor: Weijun Wan, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 110 days.

(21) Appl. No.: 18/081,021

(22) Filed: Dec. 14, 2022

(65) Prior Publication Data

US 2023/0168820 A1 Jun. 1, 2023

Related U.S. Application Data

(63) Continuation of application No. PCT/CN2022/132288, filed on Nov. 16, 2022.

(30) Foreign Application Priority Data

Nov. 29, 2021 (CN) .......................... 202111447894.5

(51) Int. Cl.
*G06F 3/06* (2006.01)
*G11C 16/04* (2006.01)
(Continued)

(52) U.S. Cl.
CPC .......... *G06F 3/0626* (2013.01); *G06F 3/0656* (2013.01); *G06F 3/0679* (2013.01);
(Continued)

(58) Field of Classification Search
CPC .... G06F 3/0626; G06F 3/0656; G06F 3/0679; G11C 16/0483; G11C 16/10; G11C 16/26; G11C 16/3459; G11C 16/24
See application file for complete search history.

(56) References Cited

U.S. PATENT DOCUMENTS 5,754,469 A * 5/1998 Hung ................... G11C 11/5621
365/185.12
2012/0155190 A1* 6/2012 Kim ..................... G11C 11/5642
365/189.05

(Continued)

FOREIGN PATENT DOCUMENTS

CN 102314925 A 1/2012
CN 104240749 A 12/2014
(Continued)

OTHER PUBLICATIONS

International Search Report issued in corresponding International Application No. PCT/CN2022/132288, mailed Feb. 9, 2023, 3 pages.

*Primary Examiner* — Charles Rones
*Assistant Examiner* — Hewy H Li
(74) *Attorney, Agent, or Firm* — BAYES PLLC

(57) ABSTRACT

In one aspect, a page buffer includes a first latch configured to store program verification information; a second latch configured to store first bit line forced information; and a dynamic latch configured to store second bit line forced information. The first bit line forced information is different from the second bit line forced information. The dynamic latch includes a control switch coupled to the second latch. And the dynamic latch is configured to store information through a capacitor to which the control switch is coupled.

20 Claims, 6 Drawing Sheets

(51) Int. Cl.
  *G11C 16/10*  (2006.01)
  *G11C 16/24*  (2006.01)
  *G11C 16/26*  (2006.01)
  *G11C 16/34*  (2006.01)
(52) U.S. Cl.
  CPC .............. *G11C 16/10* (2013.01); *G11C 16/24* (2013.01); *G11C 16/26* (2013.01); *G11C 16/0483* (2013.01); *G11C 16/3459* (2013.01)

(56) References Cited

U.S. PATENT DOCUMENTS

| | | | |
|---|---|---|---|
| 2013/0094292 A1* | 4/2013 | Park | ................... G11C 16/0483 |
| | | | 365/185.03 |
| 2017/0110185 A1* | 4/2017 | Hahn | ................... G11C 11/5642 |
| 2017/0358335 A1 | 12/2017 | Yang | |
| 2018/0144800 A1* | 5/2018 | Park | ....................... G11C 16/10 |
| 2022/0051729 A1* | 2/2022 | Cho | ......................... H01L 24/08 |

FOREIGN PATENT DOCUMENTS

| | | |
|---|---|---|
| CN | 104464811 A | 3/2015 |
| CN | 107346666 A | 11/2017 |
| CN | 108091365 A | 5/2018 |
| CN | 113409848 A | 9/2021 |
| CN | 114168491 A | 3/2022 |

\* cited by examiner

PAGE BUFFER SUPPORTING DIFFERENT BIT LINE FORCING OPERATIONS USING A DYNAMIC LATCH

CROSS-REFERENCE TO RELATED APPLICATIONS

This application is a continuation of Internal Application No. PCT/CN2022/132288, filed Nov. 16, 2022, entitled "DEVICE HAVING PAGE BUFFER, MEMORY SYSTEM, AND METHOD OF OPERATING THE SAME," which claims the benefit of priority to Chinese Application No. 202111447894.5, filed on Nov. 29, 2021, both of which are incorporated by reference herein in their entireties.

BACKGROUND

The present disclosure relates to a page buffer, a memory device, a method of operating the same, and a memory system.

Semiconductor memories can be roughly divided into two categories: volatile memory and non-volatile memory, depending on whether they retain stored data when power is off. Volatile memory loses stored data when power is lost, and non-volatile memory retains stored data when power is lost.

The memory cells in the non-volatile memory are connected to the bit line and the word line, respectively, and thus have good random access characteristics. The non-volatile memory may include a plurality of memory cells connected in series corresponding to one bit line, and each memory cell string may be arranged with only one contact correspondingly, thus having good integration characteristics.

With the improvement of the integration of the memory device, the area of the area occupied by the page buffer is limited in the peripheral circuits of the memory device, and there is a demand that the area occupied by the page buffer tends to be reduced, so the number of elements constituting the page buffer also needs to be reduced.

SUMMARY

In one aspect, a page buffer includes a first latch configured to store program verification information; a second latch configured to store first bit line forced information; and a dynamic latch configured to store second bit line forced information. The first bit line forced information is different from the second bit line forced information. The dynamic latch includes a control switch coupled to the second latch. And the dynamic latch is configured to store information through a capacitor to which the control switch is coupled.

In some implementations, the second latch is coupled to a first end of the control switch.

In some implementations, when the control switch is turned on, the information stored in the second latch is transmitted to a second end of the control switch and stored in the capacitor coupled to the second end.

In some implementations, during a first sensing operation being performed based on a first forced sensing voltage, the second latch is configured to store the information for distinguishing a first memory cell to be subjected to a first bit line forcing operation of memory cells that have not passed a program verification, based on the first forced sensing voltage.

In some implementations, before a second sensing operation being performed based on a second forced sensing voltage, the control switch is turned on and a current first bit line forced information from the second latch is stored by the dynamic latch through the capacitor.

In some implementations, during the second sensing operation being performed based on the second forced sensing voltage, the second latch is configured to store the information for distinguishing a second memory cell to be subjected to a second bit line forcing operation of the memory cells that have not passed the program verification, based on the second forced sensing voltage.

In some implementations, after a third sensing operation being performed based on a program verification voltage, the dynamic latch is configured to output the first bit line forced information stored in the capacitor to a sense node, and store the second bit line forced information from the second latch when the control switch of the dynamic latch is turned on. And the second latch is configured to store the first bit line forced information at the sense node.

In some implementations, the first forced sensing voltage is lower than the second forced sensing voltage.

In some implementations, the second forced sensing voltage is lower than the program verification voltage.

In some implementations, the page buffer further includes a first precharge circuit configured to generate a first forced programming voltage. The first precharge circuit is coupled to a bit line through a sensing node. And the page buffer is configured to apply, through the first precharge circuit, the first forced programming voltage that is higher than a normal programming bit line voltage and lower than an inhibit bit line voltage, to the bit line corresponding to a first memory cell to be subjected to a first bit line forcing operation.

In some implementations, the page buffer further includes a second precharge circuit configured to generate a second forced programming voltage. The second precharge circuit is coupled to the bit line through the sensing node. The second precharge circuit is coupled to the dynamic latch and configured to be controlled by information stored in the dynamic latch. And the page buffer is configured to apply, through the second precharge circuit, a second forced programming voltage that is higher than the first forced programming voltage and lower than the inhibit bit line voltage, to the bit line corresponding to the memory cell to be subjected to a second bit line forcing operation.

In some implementations, the second precharge circuit includes a first p-channel Metal-Oxide-Semiconductor (PMOS) transistor and a second PMOS transistor connected in series between a supply voltage and the sense node, wherein a gate of the first PMOS transistor is coupled to the dynamic latch, and the second PMOS transistor is controlled by a second bit line forced operation enable signal.

In some implementations, the control switch includes a single-transistor control switch or a dual-transistor control switch.

In some implementations, the control switch is a transmission gate of a Metal-Oxide-Semiconductor (MOS) transistor.

In some implementations, the second end of the control switch is coupled to a sensing node. And the sensing node is coupled to the first latch.

In some implementations, the capacitor includes a parasite capacitor.

In another aspect, a memory device includes a memory cell array comprising a plurality of memory cell strings and a plurality of bit lines connected to the plurality of memory cell strings; and a peripheral circuit coupled to the memory cell array through the bit lines and configured to operate the memory cell array. The peripheral circuit comprises at least a page buffer connected to corresponding the bit lines via a sensing node and connected to the memory cell strings via the bit lines. And the page buffer includes a first latch configured to store program verification information; a second latch configured to store first bit line forced information; and a dynamic latch configured to store second bit line forced information. The first bit line forced information is different from the second bit line forced information. The dynamic latch includes a control switch coupled to the second latch. The dynamic latch is configured to store information through a capacitor to which the control switch is coupled.

In some implementations, the peripheral circuit is configured to: based on the program verification information, the first bit line forced information, and the second bit line forced information, apply a normal programming bit line voltage to a normal programming cell and apply an inhibit bit line voltage to an inhibit cell, apply a first forced programming voltage that is higher than the normal programming bit line voltage and lower than the inhibit bit line voltage to a first memory cell to be subjected to a first bit line forcing operation, and apply a second forced programming voltage that is higher than the first forced programming voltage and lower than the inhibit bit line voltage to a second memory cell to be subjected to a second bit line forcing operation.

In some implementations, the memory cell array is a three-dimensional (3D) NAND flash memory cell array.

In still another aspect, a method of programming a memory device includes performing a first sensing operation based on a first forced sensing voltage; storing a result of the first sensing operation to a second latch; exchanging information stored in the second latch and a dynamic latch; performing a second sensing operation based on a second forced sensing voltage different from the first forced sensing voltage; storing a result of the second sensing operation to the second latch; performing a third sensing operation based on a verification voltage; storing a result of the third sensing operation to a first latch; and exchanging information stored in the second latch and the dynamic latch.

In some implementations, the result of the first sensing operation is a first bit line forced information which indicates that a first forced cell has passed the verification of the first forced sensing voltage, the result of the second sensing operation is a second bit line forced information which indicates that a second forced cell has passed the verification of the second forced sensing voltage, and the result of the third sensing operation is a program verification information which indicates an inhibit cell that has passed the verification of the verification voltage.

In some implementations, the dynamic latch stores the first bit line forced information from the second latch to a capacitor coupled to a control switch.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
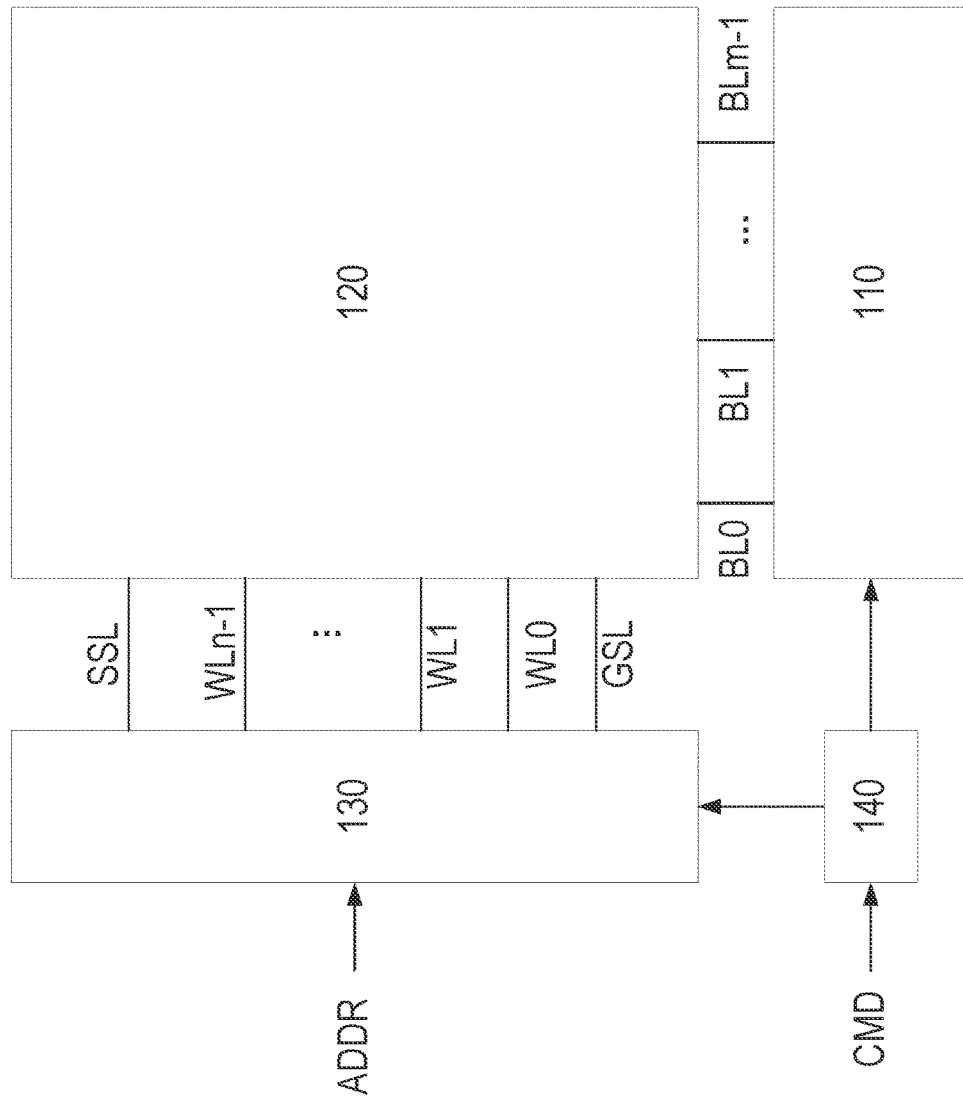
FIG. 1 illustrates a block diagram of a memory device according to some implementations of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

FIG. 1 is a schematic diagram of a storage device according to some implementations of the present disclosure. A memory device 100 may include a memory cell array 120, a page buffer circuit 110 coupled to memory cell array 120, a row decoder 130 coupled to memory cell array 120, and a control logic 140 coupled to row decoder 130 and page buffer circuit 110. Page buffer circuit 110, row decoder 130, and control logic 140 may be implemented in the memory in the peripheral circuits of the device. Although memory device 100 is shown as a flash memory device (e.g., a vertical NAND flash memory), it is to be understood that the solutions or techniques of the present disclosure are not limited to application in flash memory devices, and can be applied to other types of flash memory devices in non-volatile memory that requires different bit line voltages to be applied differently to different programming cells during programming, such as Read-Only Memory (ROM), Programmable Read-Only Memory (PROM), Erasable Programmable Read-Only Memory (EPROM), Electrically Erasable Programmable Read-Only Memory (EEPROM), Phase Change Random Access Memory (PRAM), Magnetoresistive Random Access Memory (MRAM), Resistive Random Access Memory (RRAM), Ferroelectric Random Access Memory (FRAM), etc.

Page buffer circuit 110 may function as a write driver or as a sense amplifier depending on the mode of operation. During a programming operation, page buffer circuit 110 may transmit bit line voltages corresponding to the memory cells to be programmed (also simply referred to as "programmed cells") to the bit lines of memory cell array 120. During a read operation, page buffer circuit 110 may sense data stored in a selected memory cell through a bit line. Page buffer circuit 110 may store the sensed data and output the latched data.

The memory cells in memory cell array 120 may be formed by a plurality of, e.g., NAND memory cells arranged in rows and columns. Each row of memory cells is connected to a corresponding word line, and each column of memory cells is connected to a corresponding bit line. Memory cell array 120 may be connected to row decoder 130 via the word lines WL0 to WLn−1, String Select Line (SSL), and Ground Select Line (GSL). During programming, control logic 140 may control the voltage biased on the word line. For example, the programming voltage Vpgm is biased on a selected word line to program the memory cells to be programmed on the selected word line to a certain data state. Memory cell array 120 may be connected to page buffer circuit 110 via the bit lines BL0 to BLm−1. Memory cell array 120 may include a plurality of memory cell strings. Each memory cell string may be connected to a bit line via a String Selection Transistor (SST). Memory cell array 120 may be formed by a memory plane including a plurality of memory blocks, the plurality of memory blocks may include a plurality of memory pages, and the plurality of memory pages may include a plurality of memory cells.

Row decoder 130 may select any one of the memory blocks of memory cell array 120 in response to the address (ADDR). Row decoder 130 may select any one of the word lines of the selected memory block. Row decoder 130 may transmit the word line voltage to the word line of the selected memory block.

Control logic 140 may receive the programming command (CMD) from a host, and may output various control signals for controlling page buffer circuit 110 and row decoder 130 to perform programming operations in response to the programming command CMD. Control logic 140 may be implemented by a controller/processing core and corresponding firmware program of the peripheral circuit.

Figure 2:
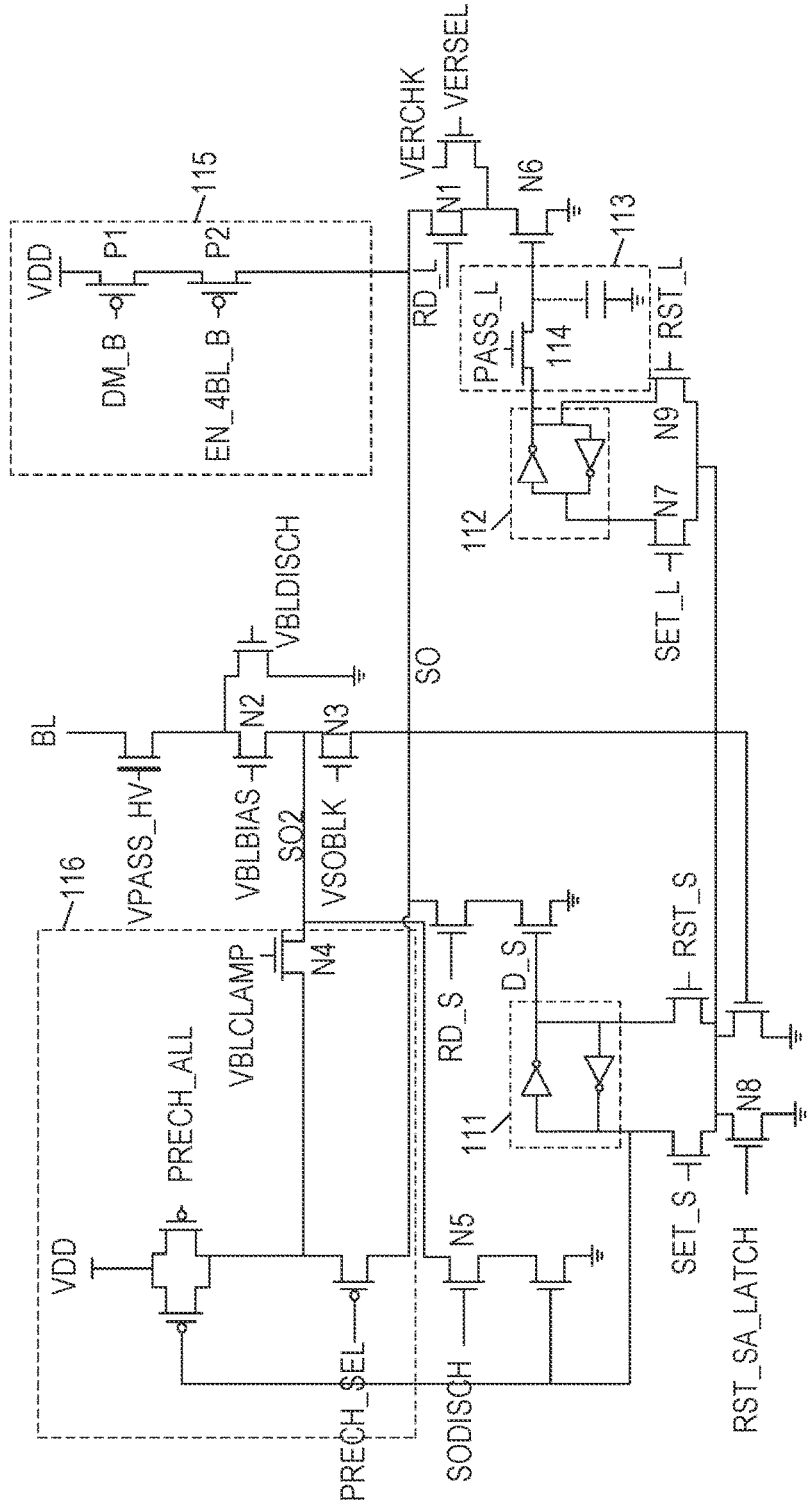
FIG. 2 illustrates a schematic circuit diagram of a page buffer of a memory device according to some implementations of the present disclosure.

FIG. 2 is a partial circuit diagram of a page buffer according to some implementations of the present disclosure. Page buffer circuit 110 (e.g., in FIG. 1) may include one or more page buffers 200. E.g., one page buffer is provided corresponding to one bit line. Each page buffer 200 may include at least a first latch 111, a second latch 112, and a dynamic latch 113. The latched information stored in first latch 111, second latch 112, and dynamic latch 113 may include information required by the memory cells on the corresponding bit lines during the programming operation.

In some implementations, an Incremental Step-Pulse Programming (ISPP) programming scheme of a 3D NAND flash memory device is applied as an example. In different programming stages of the ISPP programming process, to optimize the threshold voltage distribution and let the thresholds of the programming cells be relatively more concentrated, the bit lines of the programming cells of different bit lines are biased with different bit line voltages, that is, the forcing operation of the bit lines is realized. In this way, even if the programming voltage Vpgm of the gates of programming cells (e.g., applied through word lines) of different bit lines is the same, the programming effect will be different. The difference in threshold voltage of the current programming cells with a large difference in threshold voltage is reduced after being programmed, and is relatively close to the ideal threshold voltage region of the corresponding data state.

In some implementations, first latch 111 may store information on the third sensing operation, and second latch 112 and dynamic latch 113 may store information on the bit line forcing operation according to the control command. In some implementations of the present disclosure, second latch 112 and dynamic latch 113 may store 4 different bit line voltages. A detailed description thereof will be described below with reference to FIG. 2.

It should be noted that each page buffer may further include a data latch (not shown in FIG. 2). Data latches are used to cache data to be programmed into the memory cell array. When the memory device is a triple-level cells (TLC) memory device, the TLC memory device can store 3-bit data, namely Lower Page (LP) data, Middle Page (MP) data, and Upper Page (UP) data. Correspondingly, the data latch may include three data latches: LP latch, MP latch, and UP latch. When the memory device is a quad-level cells (QLC) memory device, the QLC memory device can store 4-bit data, namely, LP data, MP data, UP data, and Extra Page (XP) data. Correspondingly, the data latch may include four data latches: LP latch, MP latch, UP latch, and XP latch.

First latch 111 may store information of the third sensing operation during the programming operation. Specifically, first latch 111 may store information for distinguishing a memory cell to be inhibited from the memory cells based on a program verification voltage. That is, the information that distinguishes a memory cell to be programmed and a memory cell to be inhibited from each other may be stored in first latch 111. During the third sensing operation, page buffer 200 may apply different bit line voltages to the memory cells to be programmed and memory cells to be inhibited by using the program/inhibit distinguishing information applied to the sensing node SO stored in first latch 111. It should be noted that the program verification information stored in first latch 111 is information obtained based on the program verification voltage Vvfy.

Second latch 112 may store information of the first bit line forcing operation during a program operation. Specifically, second latch 112 may store information for distinguishing a memory cell to be subjected to the first bit line forcing operation (e.g., a first memory cell) from the memory cells not passing program verification based on the first forced sensing voltage, i.e., to distinguish the memory cells that are forced to operate via the first bit line and the memory cells that are not forced to operate via the first bit line. During the first bit line forcing operation, page buffer 200 may apply the first forced programming voltage to the memory to be subjected to the first bit line forcing operation by using the first bit line forced information stored in second latch 112. It is noted that the memory cells that do not pass the program verification are the programmed cells.

Dynamic latch 113 includes a control switch 114 electrically connected and/or coupled to second latch 112. Dynamic latch 113 is configured to store information in the capacitor (e.g., a normal capacitor or a parasitic capacitor)

electrically connected and/or coupled to control switch 114. Dynamic latch 113 may store a second bit line forcing operation information during the programming period. Specifically, dynamic latch 113 may include distinguishing information for distinguishing memory cells to be subjected to the second bit line forcing operation (e.g., a second memory cell) and memory cells not to be subjected to the second bit line forcing operation from each other. During the second bit line forcing operation, page buffer 200 may apply the second forced programming voltage to the memory cells to be subjected to the second bit line forcing operation by using the second bit line forced information stored in dynamic latch 113. In some implementations of the present disclosure, dynamic latch 113 may directly apply the second bit line forced information to the sensing node SO, and dynamic latch 113 is configured to store information from second latch 112 to the capacitor (e.g., parasitic capacitor) when control switch 114 is turned on. Therefore, when page buffer 200 performs the second bit line forcing operation during the program operation on the memory cells, the second bit line forced information may be obtained from dynamic latch 113.

Second latch 112 is electrically connected and/or coupled to a first end of control switch 114, and when control switch 114 is controlled to be turned on, the information stored in second latch 112 is transmitted to a second end of control switch 114 to which a capacitor (e.g., parasitic capacitor) is electrically connected and/or coupled to store the information.

In some implementations, the second end of control switch 114 is coupled to the sensing node SO of page buffer 200 through the electrically connected circuit node, and the sensing node SO is also connected and coupled to first latch 111.

In some implementations, the first bit line forced information and the second bit line forced information are different. Specifically, the first bit line forced information and the second bit line forced information are respectively bit line voltage information corresponding to different bit line forcing operations.

In some implementations, a dynamic latch is formed by setting control switch 114 at the output node of second latch 112, and the dynamic latch uses the original parasitic capacitor of the circuit node to which the control switch 114 is coupled to lock and store information. Therefore, in some implementations, the addition of new latches can be realized only by introducing a control switch rather than adding a latch structure like first latch 111 or second latch 112, thereby reducing the complexity of the circuit and minimizing the number of components (e.g., transistors) that make up the page buffer.

In addition, in some implementations of the present disclosure, it is possible to implement two programming modes of bit line forcing operation for different programming cells in one programming process. In this way, the programming cells can be prevented from being over-programmed, thereby reducing the width of the distribution of the threshold voltages among multiple memory cells and improving the accuracy of programming operations.

In some implementations, control switch 114 may be implemented by various controllable switching elements, such as Metal-Oxide-Semiconductor (MOS) transistors. In some implementations, control switch 114 may be implemented by a single-transistor control switch or a dual-transistor control switch. The transmission gate of the MOS transistor structure or the transmission gate of the dual MOS transistor structure. It should be noted that, in the embodiments of the present disclosure, the control switch is a single-transistor control switch as an example for description; here, the single-transistor control switch is composed of an n-channel MOS (NMOS) transistor, and the NMOS transistor can be turned on or turned on in response to the switch control signal PASS_L deadline. In practical application, in order to better control the dynamic latch, a two-transistor control switch can be selected as the control switch. A two-transistor control switch is a control switch formed by a p-channel MOS (PMOS) transistor and an NMOS transistor in parallel, such as a Complementary Metal-Oxide-Semiconductor (CMOS) transmission gate.

Referring to FIG. 2, the first terminal of control switch 114 is electrically connected and/or coupled to second latch 112. For example, the output node of second latch 112 may be electrically connected and/or coupled to the first terminal of control switch 114. And the second terminal of control switch 114 is electrically connected and/or coupled to the corresponding node, for example, the MOS transistor N6. The specific circuit corresponding to the node is not limited to thereto. It is understood that one or more semiconductor elements (e.g., MOS transistors) corresponding to the node form corresponding parasitic capacitors. When the control switch 114 is controlled to be on or off, the parasitic capacitor is used to store information, thereby realizing the dynamic latch function without additional latch structures like the first latch or the second latch. In some implementations, the parasitic capacitor may be replaced by another normal capacitor.

Figure 3:
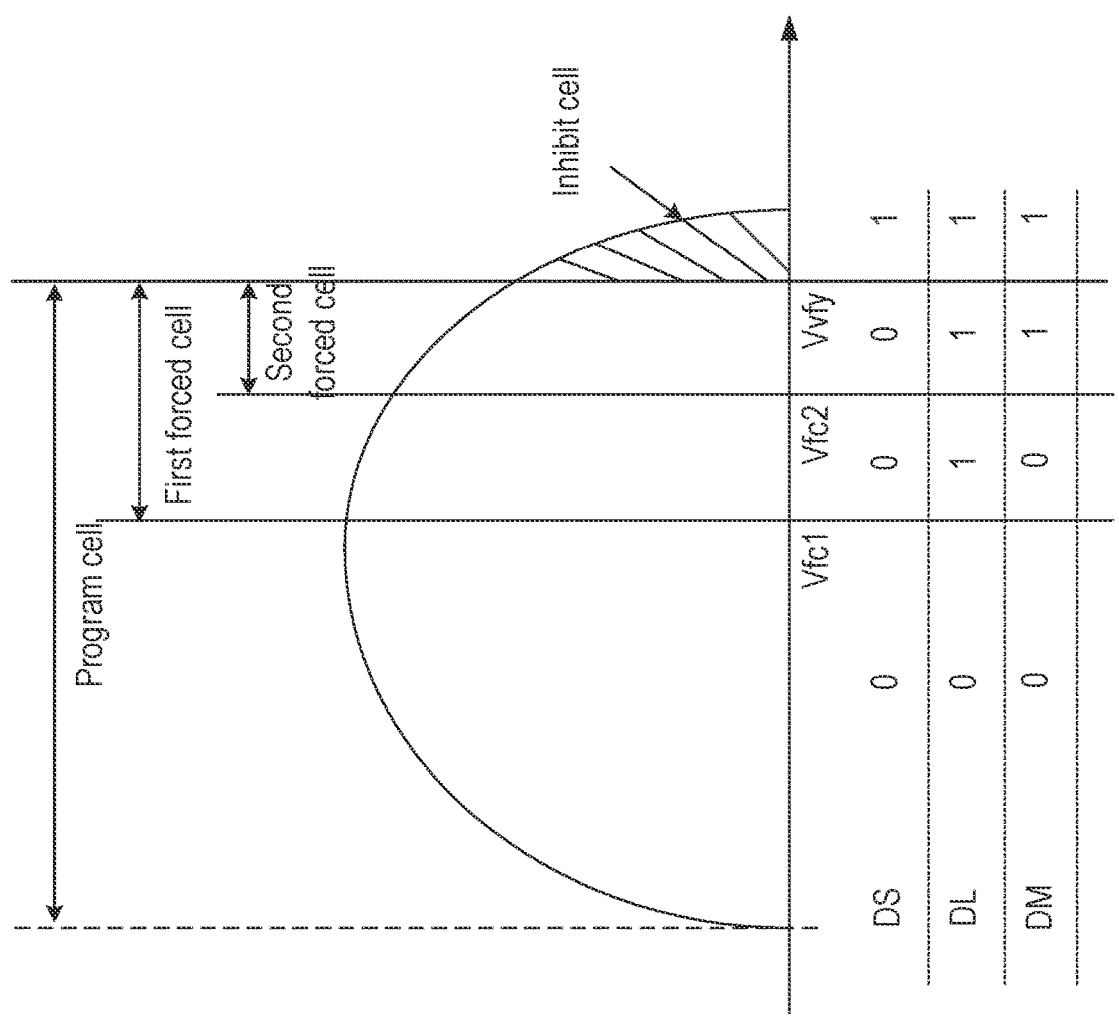
FIG. 3 illustrates a threshold voltage distribution diagram of a memory cell according to some implementations of the present disclosure.

FIG. 3 is a threshold voltage distribution diagram of a memory cell according to some implementations of the present disclosure. Referring to FIG. 2 and FIG. 3, first latch 111 may store the first latch information DS correspondingly sensed by the program verification voltage Vvfy. In some implementations of the present disclosure, a memory cell having a threshold voltage greater than the program verification voltage Vvfy may be an inhibit cell, and the first latch 111 may store "1" as the first latch information DS. Also, a memory cell having a threshold voltage level smaller than the program verification voltage Vvfy may be a program cell (e.g., PGM cell), and the first latch 111 may store "0" as the first latch information DS. Here, the first latch information DS may be program verification information.

Second latch 112 may include second latch information DL corresponding to the first forced sensing voltage Vfc1 as bit line forced information for the first bit line forcing operation. The first forced sensing voltage Vfc1 may be smaller than the program verification voltage Vvfy. In some implementations of the present disclosure, a memory cell having a threshold voltage greater than the first forced sensing voltage Vfc1 and less than the program verification voltage Vvfy may be a memory cell to be subjected to a bit line forcing operation in the next programming process, which is called the first forced cell. It should be noted that the bit line forcing operation in some implementations of the present disclosure includes a first bit line forcing operation and a second bit line forcing operation. And a memory cell having a threshold voltage greater than the first forced sensing voltage Vfc1 and less than the second forced sensing voltage Vfc2 may be a memory cell to be subjected to a first bit line forcing operation. The second forced cell is removed from the first forced cell. That is, the remaining first forced cells are memory cells to be subjected to the first bit line forcing operation. In other words, the first forced cell includes a memory cell to be subjected to the first bit line forcing operation and a memory cell to be subjected to the second bit line forcing operation. When the threshold voltage of the programming cell is greater than the first forced sensing voltage Vfc1, second latch 112 may store "1" as the second latch information DL. In addition, a memory cell having a threshold voltage smaller than the first forced sensing voltage Vfc1 is not a first forced cell but a normal programming cell performing a normal programming operation. Second latch 112 may store "0" as the second latch information DL. Here, the second latch information DL may be the first bit line forced information, and if the first forced information stored in DM is "0", it means that the programming cells corresponding to the bit line will not perform the first bit line forcing operation. It should be noted that a normal programming cell is a memory cell that does not perform the forced bit line operation among the programming cells. Therefore, in some implementations, the normal programming cell may also be referred to as a programming cell that is not subjected to the forcing operation.

Dynamic latch 113 may include third latch information DM corresponding to the second forced sensing voltage Vfc2 as bit line forced information for the second bit line forcing operation. The second forced sensing voltage Vfc2 may be smaller than the program verification voltage Vvfy and greater than the first forced sensing voltage Vfc1. In some implementations of the present disclosure, a memory cell having a threshold voltage greater than the second forced sensing voltage Vfc2 and less than the program verification voltage Vvfy may be a memory cell to be subjected to a second bit line forcing operation, referred to herein as the second forced cell. When the threshold voltage is greater than the second forced sensing voltage Vfc2, the dynamic latch 113 may store "1" as the third latch information DM. In addition, a memory cell with a threshold voltage smaller than the second forced sensing voltage Vfc2 is not a second forced cell, but a normal programming cell performing a normal programming operation and a memory cell performing a first bit line forcing operation, and then dynamic latch 113 may store "0" as the third latch information DM. Here, the third latch information DM may be the second bit line forced information. When the second forced information stored in DM is "0", it means that the programming cell corresponding to the bit line will not perform the second bit line forcing operation.

In a programming process such as ISPP, when a same programming voltage Vpgm is applied to the memory cells of a selected row to perform a programming operation, page buffer 200 can use the first latch information DS, the second latch information DL, and the third latch information to apply corresponding bit line voltages to corresponding memory cells, so that the memory cells can be differentiated to perform corresponding bit line forcing operations. In other words, in some implementations of the present disclosure, different memory cells are classified and programmed, and the memory cells can be divided into normal programming cells, memory cells to be subjected to the first bit line forcing operation, and memory cells and inhibit cells to be subjected to the second bit line forcing operation. The classification and programming of these 4 types of memory cells may use different bit line voltages.

In some implementations of the present disclosure, page buffer 200 further includes: a first precharge circuit 116 generating a first forced programming voltage. First precharge circuit 116 is electrically connected and/or coupled to a bit line through the sensing node SO. Page buffer 200 is configured to apply, through first precharge circuit 116, a first forced programming voltage that is higher than the normal programming bit line voltage and lower than the inhibit bit line voltage to the corresponding memory cells to be subjected to the first bit line forcing operation. It should be noted that first precharge circuit 116 is further configured to apply the inhibit bit line voltage to the bit line corresponding to the memory cell to be inhibited (e.g., inhibit cell).

In some implementations of the present disclosure, page buffer 200 further includes a second precharge circuit 115 for generating a second forced programming voltage. Second precharge circuit 115 is connected to a bit line through the sensing node, and second precharge circuit 115 is electrically connected and/or coupled to the dynamic latch and capable of being controlled by information stored in the dynamic latch. Page buffer 200 is configured to apply, through second precharge circuit 115, a voltage that is higher than a first forced programming voltage and a second forced programming voltage and lower than a second forced programming voltage for inhibiting the programming bit line voltage, to a memory cell to be subjected to the second bit line forcing operation.

In some implementations of the present disclosure, second precharge circuit 115 includes two PMOS transistors connected in series between the power supply voltage and the sensing node. Referring to FIG. 2, second precharge circuit 115 includes a first PMOS transistor P1 and a second PMOS transistor P2, the first PMOS transistor P1 may be turned on or off in response to the dynamic latch signal DM_B, and the second PMOS transistor P2 may be turned on or off in response to the second forced information EN_4BL_B. It should be noted that the first PMOS transistor P1 and the second end of control switch 114 are connected by wires (not shown in the figure), so that the dynamic latch signal DM_B is a signal controlled by the information stored in dynamic latch 113.

Page buffer 200 may perform a program operation including a first bit line forcing operation and a second bit line forcing operation using a three-step sensing method. During the programming operation, in addition to using two bit line voltages, the inhibit bit line voltage Vinh (such as Vdd) and the normal programming bit line voltage Vprog (such as the ground voltage Vgnd), it can use only one additional forced programming voltage (which is greater than the normal programming bit line voltage Vprog and is lower than the inhibit bit line voltage Vinh) to perform programming operations on a plurality of programming cells. Although a programming operation with a certain degree of programming differentiation can be achieved, the threshold voltage distribution of the plurality of programming cells after being programmed may not be narrow enough. Therefore, in the programming operation according to some implementations of the present disclosure, in addition to using the two bit line voltages of the inhibit bit line voltage Vinh (e.g., the power supply voltage VDD) and the normal programming bit line voltage Vprog (e.g., the ground voltage Vgnd), two forced programming voltages are also used (both of which are greater than the normal programming bit line voltage Vprog and lower than the inhibit bit line voltage Vinh), thereby performing a programming operation with a finer degree of programming differentiation on a plurality of programming cells.

Page buffer 200 may perform the first programming on the normal programming cells with the normal programming bit line voltage Vprog based on the first forced sensing voltage Vfc1 and the second forced sensing voltage Vfc2. Page buffer 200 may also perform the first bit line forcing operation on the memory cells to be subjected to the first bit line forcing operation by using the first forced programming voltage. And page buffer 200 may also perform the second bit line forcing operation on the memory cells to be subjected to the second bit line forcing operation by using the second forced programming voltage. Specifically, page buffer 200 may perform a bit line forcing operation by applying a first forced programming voltage to memory cells to be subjected to a first bit line forcing operation and applying a second forced programming voltage to memory cells to be subjected to a second bit line forcing operation. The first forced programming voltage is greater than the normal programming bit line voltage Vprog and lower than the inhibit bit line voltage Vinh, and the second forced programming voltage is higher than the first forced programming voltage and lower than the inhibit bit line voltage Vinh. It should be noted that the normal programming bit line voltage Vprog, the first forced programming voltage, the second forced programming voltage, and the inhibit bit line voltage Vinh are all voltages applied to the bit line during the programming process.

For example, the normal programming bit line voltage Vprog may be the ground voltage Vgnd, the inhibit bit line voltage Vinh may be the power supply voltage VDD, the first forced programming voltage may be a voltage between the power supply voltage VDD and the ground voltage Vgnd, and the second forced programming voltage may be a voltage between the first forced programming voltage and the power supply voltage VDD. Therefore, page buffer 200 may distinguish a memory cell to be inhibited (e.g., inhibit cell), a first forced cell, a second forced cell, and a programming cell not to be forced to operate (e.g., normal programming cell) from each other, based on the first latch information DS, the second latch information DL, and the third latch information DM. In more detail, page buffer 200 may use the first latch information DS to distinguish programming cells and inhibit cells from each other in the program verify operation. Page buffer 200 may also use the second latch information DL to distinguish the first forced cells and programming the memory cells that are not forced to operate (e.g., normal programming cells) from each other in the program verify operation. Page buffer 200 may use the third latch information DM in the second bit line forcing operation to distinguish the second forced cell from the first forced cell, and the memory cells that are not forced to operate (e.g., normal programming cells). Therefore, page buffer 200 may apply the inhibit bit line voltage Vinh to the inhibit memory cells, the first forced programming voltage to the memory cells to be subjected to the first bit line forcing operation, the second forced programming voltage to the memory cells to be subjected to the second bit line forcing operation, and the normal programming bit line voltage Vprog to the programming cells that are not to be forced to operate (e.g., normal programming cells).

Figure 4:
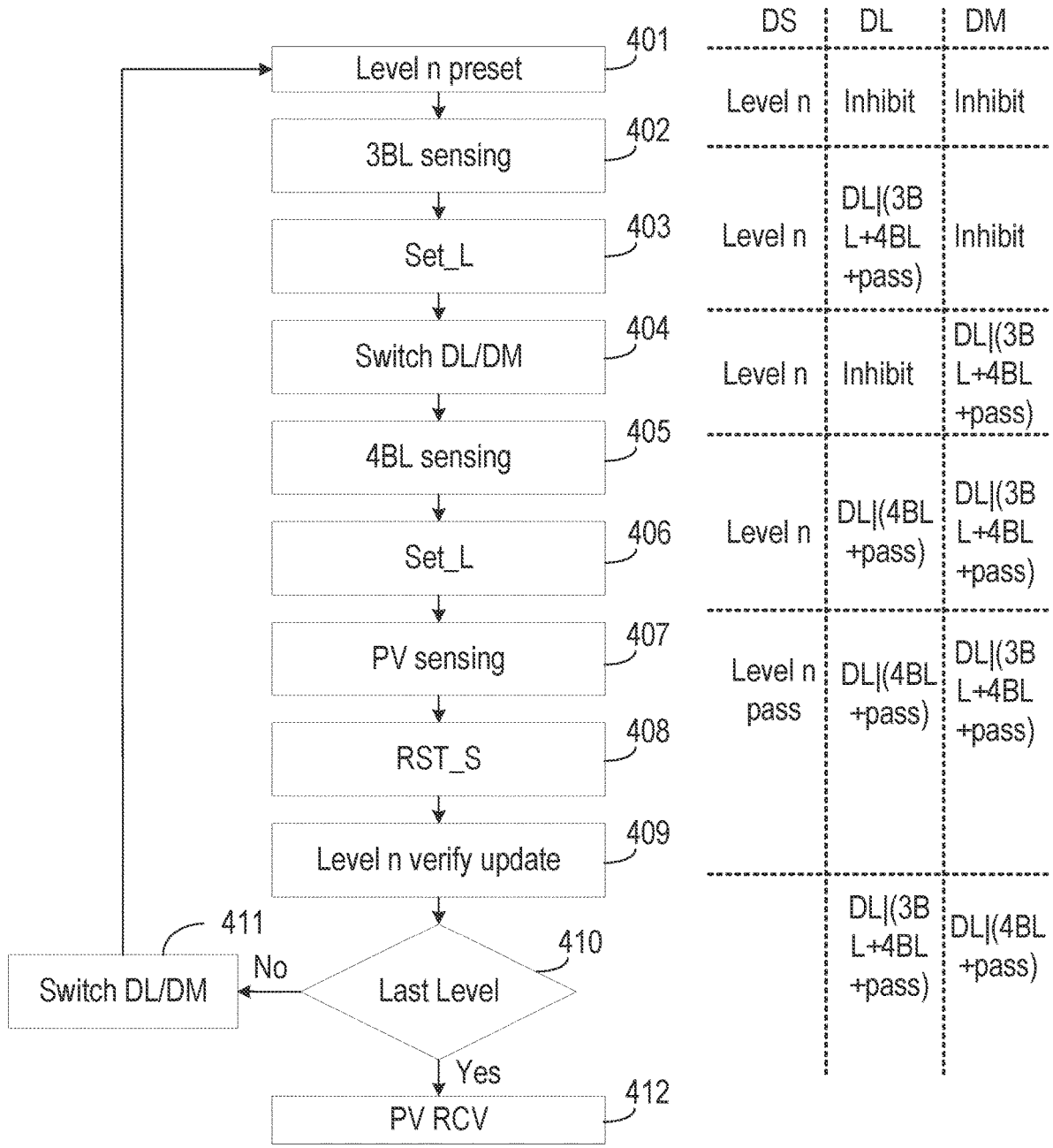
FIG. 4 illustrates a flowchart of a program verify operation of a memory device according to some implementations of the present disclosure.

FIG. 4 is a flowchart of a program verification operation of a memory device according to some implementations of the present disclosure. The program verify operation is used to verify whether the memory cells are programmed to the corresponding target threshold voltages. The flow of the program verification operation will be described with reference to FIGS. 2 to 4. The program verification operation of the memory device includes the following operations:

Operation 401: Execute verification state preset.

The present disclosure does not limit the number of bits stored in each memory cell. The present disclosure is described by taking a TLC with a storage bit of 3 as an example, and the TLC has 8 states (e.g., LV0-LV7). Here, the verification state may be any of the eight states. At this time, due to the sensing operation, the inhibit cell, the first forced cell, the second forced cell, and the normal programming cell are not determined, so the verification status information is stored in first latch 111, and the inhibit information is stored in second latch 112 and dynamic latch 113. The verification status information is used to indicate the current verification status. The inhibit information may be formed of logic "1" and logic "0", wherein logic "1" indicates that the memory cell is not to be programmed, and logic "0" indicates that the memory cell is to be programmed.

Operation 402: Perform a first sensing operation based on the first forced sensing voltage.

Here, the first forced sensing voltage Vfc1 corresponding to the verification state may be applied to the word line of the memory cell, thereby performing a first sensing operation (e.g., 3BL sensing) of the verification state on the memory cell. Page buffer 200 includes a sense node SO for determining the state of memory cells therein (e.g., data stored in the memory cells). The state of the memory cell can be determined by detecting the current flowing through the sense node SO.

Operation 403: Store the result of the first sensing operation in the second latch.

In some implementations of the present disclosure, second latch 112 is configured to store a first bit line forced information for distinguishing a memory cell to be subjected to a first bit line forcing operation (e.g., a first memory cell) among memory cells that have not passed the program verification based on the first forced sensing voltage Vfc1. In other words, after the first sensing operation is performed, the first bit line forced information may be stored in second latch 112, and the first bit line forced information indicates that the first forced cell has passed the verification of the first forced sensing voltage. Here, the result of the first sensing operation is the first bit line forced information. In some implementations, the first forced information can be written into second latch 112 by applying the control signal SET_L. The control signal SET_L is a control signal of the NMOS transistor N7, which can be turned on or off in response to the control signal SET_L.

Operation 404: Exchange the information stored in the second latch and the dynamic latch.

In some implementations of the present disclosure, referring to FIG. 2, the specific process of switching the information stored in second latch 112 and dynamic latch 113 is as follows: by applying the second forcing signal EN_4BL_B=1, the second PMOS transistor P2 is turned off; by applying the signal RD_L=1, the NMOS transistor N1 is turned on, so that dynamic latch 113 may output its stored inhibit information to the sensing node SO; by applying the switch control signal PASS_L=1, control switch 114 is turned on, so that dynamic latch 113 stores the first bit line forced information from second latch 112 to the capacitor (e.g., parasitic capacitor) that is electrically connected and/or coupled to control switch 114; by applying the control signal SET_L=1 and the control signal RST_SA_LATCH=1, the NMOS transistor N7 and the NMOS transistor N8 are turned on, thus making the second latch information DL=1 stored in second latch 112; and by applying the control signal RST_L=1, the NMOS transistor N9 is turned on, so that second latch 112 stores the inhibit information at the sensing node SO.

Operation 405: Perform a second sensing operation based on the second forced sensing voltage.

Here, the second forced sensing voltage Vfc2 corresponding to the verification state may be applied to the word line of the memory cell, thereby performing a second sensing operation (e.g., 4BL sensing) of the verification state on the memory cell.

Operation 406: Store the result of the second sensing operation in the second latch.

In some implementations of the present disclosure, after the second sensing operation is performed, the second bit line forced information may be stored in second latch 112, and the second bit line forced information indicates that the second forced cell has passed the verification of the second forced sensing voltage. Here, the result of the second sensing operation is the second bit line forced information. In some implementations, the second bit line forced information may be written into second latch 112 by applying the control signal SET_L.

Operation 407: Perform a third sensing operation based on the verification voltage.

Here, the program verification voltage Vvfy corresponding to the verification state may be applied to the word line of the memory cell, thereby performing a third sensing operation (e.g., Verify sensing) of the verification state on the memory cell.

It should be noted that the first forced sensing voltage Vfc1 is less than the second forced sensing voltage Vfc2, and the second forced sensing voltage Vfc2 is less than the programming verification voltage Vvfy.

Operation 408: Store the result of the third sensing operation in the first latch.

In some implementations of the present disclosure, first latch 111 is configured to store information, as program verification information, for distinguishing between a cell to be programmed and a memory cell to be inhibited based on a program verification voltage. After the third sensing operation is performed, program verification information may be stored to the first latch 111, and the program verification information may indicate inhibit cells that have passed the verification of the program verification voltage. Here, the result of the third sensing operation is the programming verification information. In some implementations, programming verification information can be written into the first latch 111 by applying the control signal RST_S.

Operation 409: Update verification status.

After the third sensing operation based on the program verification voltage is completed, the information stored in the corresponding latch is updated according to the result of the verification of each memory cell. Specifically, according to the result of the first sensing operation of each memory cell, the information stored in second latch 112 is updated. That is, the result of the first sensing operation is stored in second latch 112. According to the result of the second sensing operation of each memory cell, update the information stored in second latch 112. That is, the result of the second sensing operation is stored in second latch 112. According to the result of the third sensing operation of each memory cell, update the information stored in first latch 111. That is, the result of the third sensing operation is stored in first latch 111.

Operation 410: Determine whether the verification state is the highest state.

Here, taking TLC as an example, determining whether the verification status is the highest status is determining whether the verification status is LV7. If the verification state is the highest state, go to operation 412, and if the verification state is not the highest state, go to operation 411.

Operation 411: Exchange the information stored in the second latch and the dynamic latch.

In some implementations of the present disclosure, referring to FIG. 2, the specific process of exchanging the information stored in second latch 112 and dynamic latch 113 is as follows: by applying the second forcing signal EN_4BL_B=1, the second PMOS transistor P2 is turned off; by applying the signal RD_L=1, the NMOS transistor N1 is turned on, so that dynamic latch 113 may output the stored first forced information to the sensing node SO; by applying switch control signal PASS_L=1, control switch 114 is turned on, so that dynamic latch 113 stores the second bit line forced information from second latch 112 to the capacitor (e.g., parasitic capacitor) which is electrically connected and/or coupled to control switch 114; by applying the control signal SET_L=1 and the control signal RST_SA_LATCH=1, the NMOS transistor N7 and the NMOS transistor N8 are turned on, so that the second latch information DL stored in second latch 112 is set to 1; by applying the control signal RST_L=1, the NMOS transistor N9 is turned on, so that second latch 112 stores the first bit line forced information from the sensing node SO. After operation 411 is performed, operation 401 is performed to continue the program verification operation in the next state.

Operation 412: End the verification.

In some implementations of the present disclosure, a memory device is provided. Referring to FIG. 1, memory device 100 includes: memory cell array 120 and page buffer circuit 110 (e.g., having one or more page buffers 200 in FIG. 2). Memory cell array 120 has a plurality of memory cell strings and is connected to a plurality of bit lines of the plurality of memory cell strings. Page buffer 200 is connected to the bit lines via the sense node SO, and is connected to the memory cell strings via the bit lines.

In some implementations of the present disclosure, page buffer 200 is configured to: apply a normal programming bit line voltage to program the memory cells that are not forced to operate based on the program verification information, the first bit line forced information, and the second bit line forced information; apply the inhibit bit line voltage to the memory cells to be inhibited; apply a first forced programming voltage higher than normal programming bit line voltage and lower than the inhibit bit line voltage to the memory cells to be subjected to the first bit line forced operation; and apply a second forced programming voltage higher than the first forced programming voltage and lower than the inhibit bit line voltage to the memory cell to be subjected to the second bit line forced operation.

Here, the normal programming bit line voltage Vprog may be the ground voltage Vgnd. The inhibit bit line voltage Vinh may be the power supply voltage VDD. The first forced programming voltage may be a voltage between the power supply voltage VDD and the ground voltage Vgnd. The second forced programming voltage may be a voltage between the first forced programming voltage and the power supply voltage VDD. It should be noted that the normal programming bit line voltage Vprog, the first forced programming voltage, the second forced programming voltage, and the inhibit bit line voltage Vinh are all voltages applied to the bit line.

Figure 5:
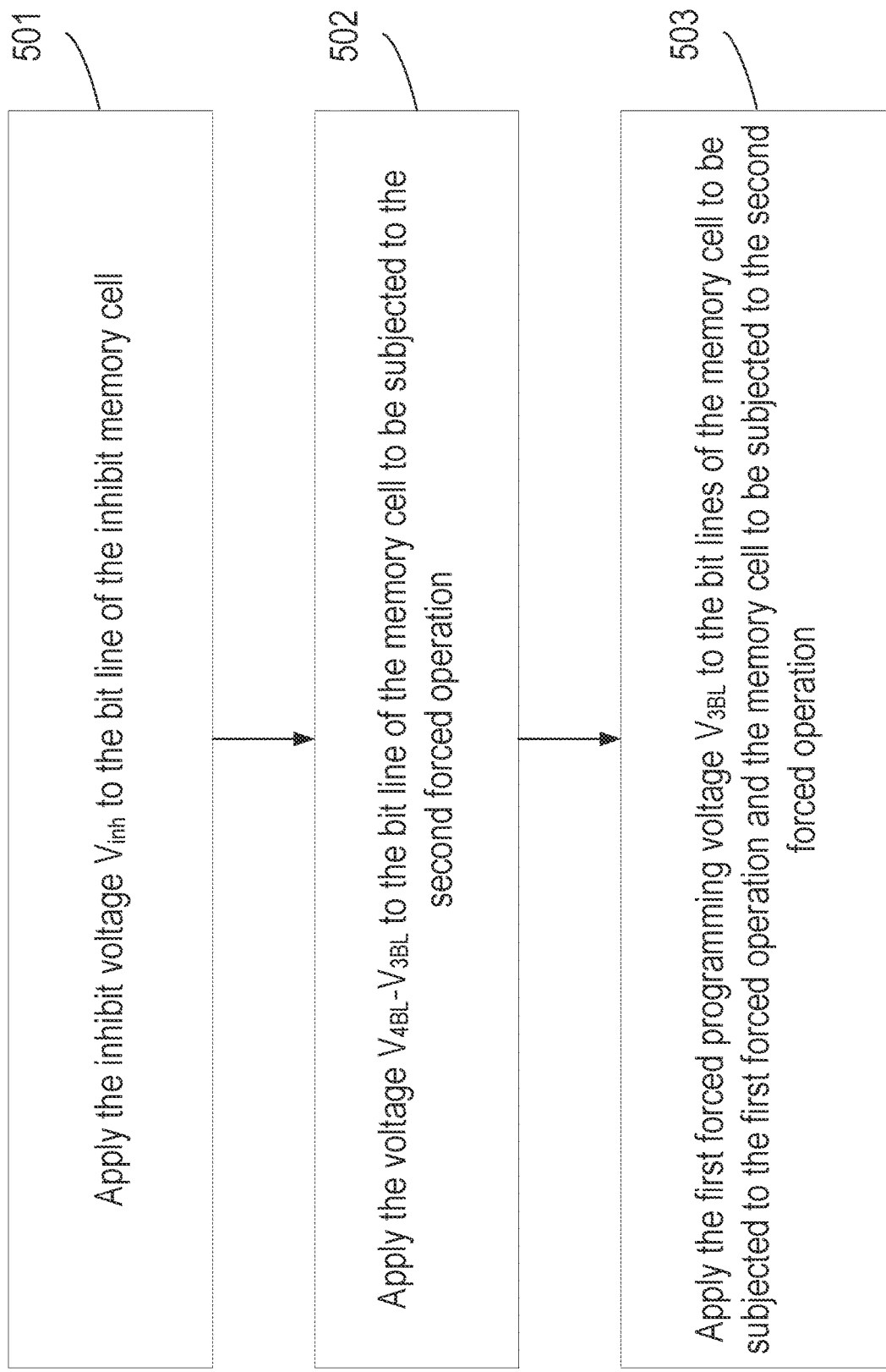
FIG. 5 illustrates a flowchart of a bit line forcing operation of a memory device according to some implementations of the present disclosure.

In some implementations of the present disclosure, after the third sensing operation is performed based on the verification voltage, the corresponding bit line voltage may be applied to the corresponding memory cells based on the information stored in first latch 111, second latch 112, and dynamic latch 113, so that the memory cells can be differentiated for bit line forcing operations. FIG. 5 is a flowchart of a bit line forcing operation of a memory device according to some implementations of the present disclosure. Referring to FIGS. 4 and 5, after the third sensing operation is performed based on the verification voltage, the programming verification information is stored in first latch 111, the second bit line forced information is stored in second latch 112, and the first bit line forced information is stored in dynamic latch 113. Here, the program verification information may indicate inhibit cells that have passed program verification under the program verification voltage. In other words, inhibit cells can be determined through program verification information. In operation 501, an inhibit bit line voltage Vinh (e.g., the power supply voltage VDD) is applied to the bit lines of the memory cells to be inhibited (e.g., inhibit cells). At this time, the normal programming bit line voltage Vprog (e.g., the ground voltage Vgnd) may be applied to the bit lines of the memory cells to be subjected to the bit line forced operation and the normal programming cells.

Referring to FIG. 2, the specific implementation process may be: the NMOS transistor N2 is turned on by the bit line bias signal VBLBIAS=V2X; the NMOS transistor N3 is turned on by the sensing node signal VSOBLK=V2X; the bit line clamping signal VBLCLAMP=0, so that the NMOS transistor N4 is turned off; the second forcing signal EN_4BL_B=1, so that the second PMOS transistor P2 is turned off and the inhibit bit line voltage (Vinh) (e.g., the power supply voltage VDD) can be applied to the bit line of the inhibit cell based on the program verification information stored in first latch 111. Here, V2X can be equal to twice VDD.

In operation 502, voltages V4BL-V3BL are applied to the bit lines of the memory cells to be subjected to the second bit line forcing operation (i.e., the second forced cells shown in FIG. 3). Here, V4BL is the second forced programming voltage, and V3BL is the first forced programming voltage. At this time, a normal programming bit line voltage Vprog (e.g., ground voltage Vgnd) can be applied to the bit lines of the memory cells to be subjected to the first bit line forcing operation (i.e., removing the second forced cells from the first forced cells shown in FIG. 3) and the bit lines of the programming cells that are not be forced to operate (e.g., normal programming cells). In some implementations of the present disclosure, since control switch 114 is set at the output node of second latch 112 to form dynamic latch 113, second latch 112 cannot directly output the information stored therein to the sensing node SO. Based on that, in order to output the second bit line forced information stored in second latch 112 to the sensing node SO, it is necessary to transmit the first bit line forced information stored in dynamic latch 113 to be stored in first latch 111, and output the second bit line forced information stored in second latch 112 to dynamic latch 113 through control switch 114, so that the second bit line forced information can be output to the sensing node SO through dynamic latch 113.

Referring to FIG. 2, the process of applying the voltages V4BL-V3BL to the bit lines of the second forced cells is as follows:

By applying the bit line bias signal VBLBIAS=V2X, the NMOS transistor N2 is turned on; by applying the bit line clamping signal VBLCLAMP=0, the NMOS transistor N4 is turned off; by applying the sensing discharge signal SODISCH=0, the NMOS transistor N5 is turned off; by applying the control signal RD_L=1, the NMOS transistor N1 is turned on, so that dynamic latch 113 can output the stored second bit line forced information to the sensing node SO; by applying the second forcing signal EN_4BL_B=0, the second PMOS transistor P2 is turned on; and by applying control sense node signal VSOBLK=V4BL-V3BL+Vt, the second precharge circuit can apply the voltage V4BL-V3BL to the bit line of the second forced cell. It should be noted that, during this period, the bit line corresponding to the inhibit cell is in a floating state.

In operation 503, the first forced programming voltage V3BL is applied to the corresponding bit lines of the first forced cells (including the memory cells to be subjected to the first bit line forcing operation and the memory cells to be subjected to the second bit line forcing operation). At this time, the normal programming bit line voltage Vprog (e.g., the ground voltage Vgnd) may be applied to the bit lines of the programming cells not to be forced to operate. At this time, first latch 111 stores the first bit line forced information, and second latch 112 and dynamic latch 113 store the second bit line forced information.

Referring to FIG. 2, the process of applying the first forced programming voltage V3BL to the bit line of the first forced cell is as follows:

By applying the bit line bias signal VBLBIAS=V2X, the NMOS transistor N2 is turned on; by applying the sensing discharge signal SODISCH=1, the NMOS transistor N5 is turned on; by applying the bit line clamping signal VBLCLAMP=V3BL+Vt, the sensing node signal VSOBLK=V4BL+Vt; by applying the second forcing signal EN_4BL_B=0, the second PMOS transistor P2 is turned on, so that the first forced programming voltage V3BL is applied to the bit line of the memory cell to be subjected to the first bit line forcing operation, and the second forced programming voltage V4BL is applied to the bit line of the memory cell to be subjected to the second bit line forced operation. It should be noted that, during this period, the bit line corresponding to the inhibit cell is in a floating state.

In the process of performing the bit line forcing operation according to some implementations of the present disclosure, the voltages V4BL-V3BL are firstly applied to the bit lines of the memory cells to be subjected to the second bit line forced operation (e.g., second forced cells). The first forced programming voltage V3BL is then applied to the bit lines of the first forced cell (including the memory cell to be subjected to the first bit line forcing operation and the memory cell to be subjected to the second bit line forcing operation). In this way, the bit line voltage of the memory cell to be subjected to the second bit line forcing operation is first switched from Vgnd to V4BL-V3BL, and then from V4BL-V3BL to V4BL. The bit line voltage of the cell also switched from Vgnd to V3BL. By way of applying voltage in a "two-steps" process to perform the second bit line forcing operation, there is a step of applying the voltage to switch the bit line voltage of the memory cell to be subjected to the second bit line forcing operation from Vgnd to V4BL, and switch the bit line voltage of the memory cell to be subjected to the first bit line forcing operation from Vgnd to V3BL. When voltage is applied to the bit lines of the memory cells to be subjected to the first bit line forcing operation and the second bit line forcing operation, under "one-step" process, the difference between the bit line voltages of the bit lines of the memory cells to be subjected to the first bit line forcing operation and that of the bit lines of the memory cells to be subjected to the second bit line forcing operation is V4BL-V3BL. However, in the case of applying the voltage in the "two-steps" process, when the voltage is applied for the first time, the bit line voltage of the memory cell to be subjected to the first bit line forcing operation is maintained at Vgnd, which is less affected by the bit line voltage of the memory cell to be subjected to the second bit line forcing operation. And when the voltage is applied for the second time, the change value of the bit line voltage of the memory cell to be subjected to the second bit line forcing operation is V3BL, and the change value of the bit line voltage of the memory cell to be subjected to the first bit line forcing operation of is also V3BL. In contrast, in the case of applying voltage in the "one-step" process, the change value of the bit line voltage of the memory cell to be subjected to the second bit line forcing operation is V4BL, and the change value of the bit line voltage of the memory cell to be subjected to the first bit line forcing operation is V3BL. Compared with the "one-step" voltage application process, the "two-steps" voltage application process has a smaller difference in the change value of the bit line voltage of the memory cells to be subjected to the first bit line forcing operation and the second bit line forcing operation. Therefore, the method of applying the voltage in "two-steps" can reduce the interference between the memory cells.

In the present disclosure, a page buffer is provided, the page buffer includes a first latch for storing program verification information, a second latch for storing first bit line forced information, and a dynamic latch for storing the second bit line forced information. The second latch and the dynamic latch are connected through a control switch. And the dynamic latch is configured to store information through the capacitor (e.g., parasitic capacitor).

In the present disclosure, a dynamic latch is formed by arranging a control switch at the output node of the second latch. By arranging a control switch in the page buffer, the dynamic latch borrows the original value of the circuit node to which the control switch is coupled. Some capacitors (e.g., parasitic capacitors) are used to store information. Thus, in some implementations of the present disclosure, the addition of new latches can be realized only by introducing control switches. Compared with, for example, the circuit structure of first latch 111 or second latch 112, its circuit structure is relatively simple, so that the number of electronic components (e.g., transistors) used in the page buffer can be reduced to a certain extent.

Figure 6:
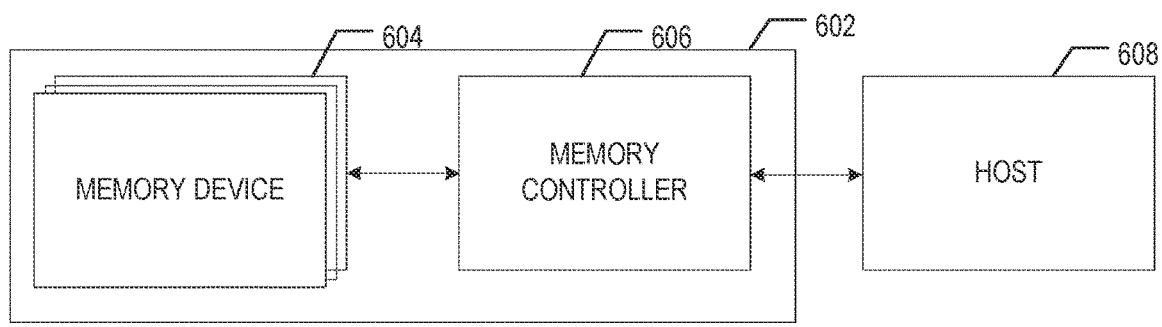
FIG. 6 illustrates a block diagram of an exemplary system having a memory device, according to some implementations of the present disclosure.

FIG. 6 illustrates a block diagram of a system 600 having a memory device, according to some aspects of the present disclosure. System 600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 6, system 600 can include a host 608 and a memory system 602 having one or more memory devices 604 and a memory controller 606. Host 608 can be a processor of an electronic device, such as a central processing unit (CPU), or a system-on-chip (SoC), such as an application processor (AP). Host 608 can be configured to send or receive the data to or from memory devices 604.

Memory devices 604 can be any memory devices disclosed herein, such as memory devices 100. In some implementations, each memory device 604 includes a memory device having at least a page buffer 200, as described above in detail.

Memory controller 606 is coupled to memory device 604 and host 608 and is configured to control memory device 604, according to some implementations. Memory controller 606 can manage the data stored in memory device 604 and communicate with host 608. In some implementations, memory controller 606 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 606 is designed for operating in a high duty-cycle environment SSDs or embedded multi-media-cards (eMMCs) used as data storage for mobile devices, such as smartphones, tablets, laptop computers, etc., and enterprise storage arrays. Memory controller 606 can be configured to control operations of memory device 604, such as read, erase, and program operations. Memory controller 606 can also be configured to manage various functions with respect to the data stored or to be stored in memory device 604 including, but not limited to bad-block management, garbage collection, logical-to-physical address conversion, wear leveling, etc. In some implementations, memory controller 606 is further configured to process error correction codes (ECCs) with respect to the data read from or written to memory device 604. Any other suitable functions may be performed by memory controller 606 as well, for example, formatting memory device 604. Memory controller 606 can communicate with an external device (e.g., host 608) according to a particular communication protocol. For example, memory controller 606 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 7A:
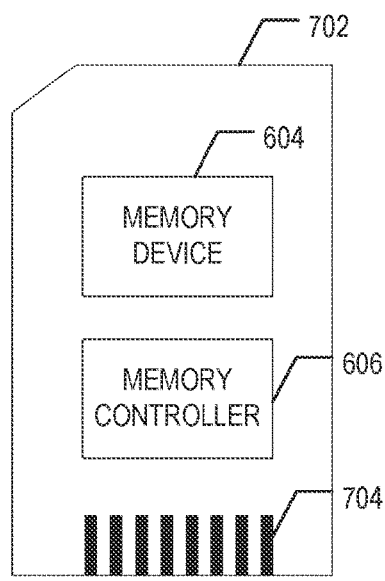
FIG. 7A illustrates a diagram of an exemplary memory card having a memory device, according to some implementations of the present disclosure.
Figure 7B:
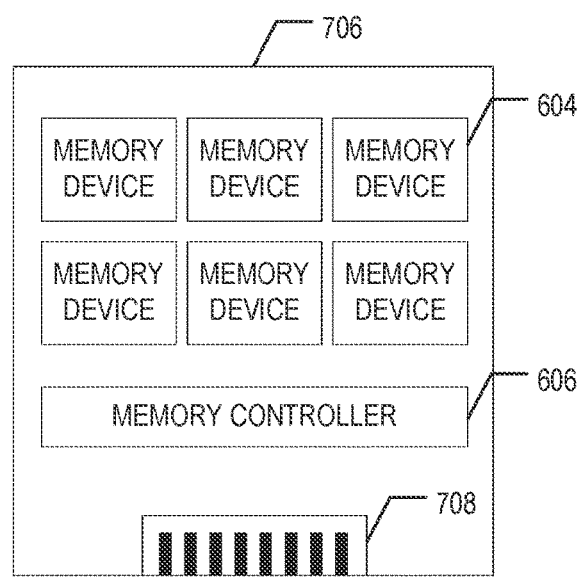
FIG. 7B illustrates a diagram of an exemplary solid-state drive (SSD) having a memory device, according to some implementations of the present disclosure.

Memory controller 606 and one or more memory devices 604 can be integrated into various types of storage devices, for example, be included in the same package, such as a universal Flash storage (UFS) package or an eMMC package. That is, memory system 602 can be implemented and packaged into different types of end electronic products. In one example as shown in FIG. 7A, memory controller 606 and a single memory device 604 may be integrated into a memory card 702. Memory card 702 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 702 can further include a memory card connector 704 coupling memory card 702 with a host (e.g., host 608 in FIG. 6). In another example as shown in FIG. 7B, memory controller 606 and multiple memory devices 604 may be integrated into an SSD 706. SSD 706 can further include an SSD connector 708 coupling SSD 706 with a host (e.g., host 608 in FIG. 6). In some implementations, the storage capacity and/or the operation speed of SSD 706 is greater than those of memory card 702.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A page buffer, comprising:
   a first latch configured to store program verification information;
   a second latch configured to store first bit line forced information;
   a dynamic latch configured to store second bit line forced information, wherein the first bit line forced information is different from the second bit line forced information, and the dynamic latch comprises a control switch coupled to the second latch, wherein the dynamic latch is configured to store information through a capacitor to which the control switch is coupled;
   a first precharge circuit configured to generate a first forced programming voltage, wherein the first precharge circuit is coupled to a bit line through a sensing node; and
   a second precharge circuit configured to generate a second forced programming voltage, wherein the second precharge circuit is coupled to the bit line through the sensing node, wherein the second precharge circuit comprises a first p-channel Metal-Oxide-Semiconductor (PMOS) transistor and a second PMOS transistor connected in series between a supply voltage and the sense node, wherein a gate of the first PMOS transistor is coupled to the dynamic latch.

2. The page buffer of claim 1, wherein the second latch is coupled to a first end of the control switch.

3. The page buffer of claim 1, wherein when the control switch is turned on, the information stored in the second latch is transmitted to a second end of the control switch and stored in the capacitor coupled to the second end.

4. The page buffer of claim 1, wherein during a first sensing operation being performed based on a first forced sensing voltage, the second latch is configured to store first information for distinguishing a first memory cell to be subjected to a first bit line forcing operation of memory cells that have not passed a program verification, based on the first forced sensing voltage.

5. The page buffer of claim 4, wherein before a second sensing operation being performed based on a second forced sensing voltage, the control switch is turned on and a current first bit line forced information from the second latch is stored by the dynamic latch through the capacitor.

6. The page buffer of claim 5, wherein during the second sensing operation being performed based on the second forced sensing voltage, the second latch is configured to store second information for distinguishing a second memory cell to be subjected to a second bit line forcing operation of the memory cells that have not passed the program verification, based on the second forced sensing voltage.

7. The page buffer of claim 6, wherein after a third sensing operation being performed based on a program verification voltage, the dynamic latch is configured to output the first bit line forced information stored in the capacitor to a sense node, and store the second bit line forced information from the second latch when the control switch of the dynamic latch is turned on, and
   wherein the second latch is configured to store the first bit line forced information at the sense node.

8. The page buffer of claim 5, wherein the first forced sensing voltage is lower than the second forced sensing voltage.

9. The page buffer of claim 7, wherein the second forced sensing voltage is lower than the program verification voltage.

10. The page buffer of claim 1,
    wherein the page buffer is configured to apply, through the first precharge circuit, the first forced programming voltage that is higher than a normal programming bit line voltage and lower than an inhibit bit line voltage, to the bit line corresponding to a first memory cell to be subjected to a first bit line forcing operation.

11. The page buffer of claim 10,
    wherein the second precharge circuit is coupled to the dynamic latch and configured to be controlled by information stored in the dynamic latch, and
    wherein the page buffer is configured to apply, through the second precharge circuit, a second forced programming voltage that is higher than the first forced programming voltage and lower than the inhibit bit line voltage, to the bit line corresponding to the memory cell to be subjected to a second bit line forcing operation.

12. The page buffer of claim 11, wherein the second PMOS transistor is controlled by a second bit line forced operation enable signal.

13. The page buffer of claim 1, wherein the control switch comprises a single-transistor control switch or a dual-transistor control switch.

14. The page buffer of claim 1, wherein the control switch is a transmission gate of a Metal-Oxide-Semiconductor (MOS) transistor.

15. The page buffer of claim 2, wherein a second end of the control switch is coupled to the sensing node, wherein the sensing node is coupled to the first latch.

16. The page buffer of claim 1, wherein the capacitor comprises a parasite capacitor.

17. A memory device, comprising:
    a memory cell array comprising a plurality of memory cell strings and a plurality of bit lines connected to the plurality of memory cell strings; and
    a peripheral circuit coupled to the memory cell array through the bit lines and configured to operate the memory cell array, wherein the peripheral circuit comprises at least a page buffer connected to corresponding the bit lines via a sensing node and connected to the memory cell strings via the bit lines, wherein the page buffer comprises:
        a first latch configured to store program verification information;
        a second latch configured to store first bit line forced information; and
        a dynamic latch configured to store second bit line forced information, wherein the first bit line forced information is different from the second bit line forced information, and the dynamic latch comprises a control switch coupled to the second latch, wherein the dynamic latch is configured to store information through a capacitor to which the control switch is coupled,
        a first precharge circuit configured to generate a first forced programming voltage, wherein the first precharge circuit is coupled to a bit line through a sensing node; and
        a second precharge circuit configured to generate a second forced programming voltage, wherein the second precharge circuit is coupled to the bit line through the sensing node, wherein the second precharge circuit comprises a first p-channel Metal-Oxide-Semiconductor (PMOS) transistor and a second PMOS transistor connected in series between a supply voltage and the sense node, wherein a gate of the first PMOS transistor is coupled to the dynamic latch.

18. The memory device of claim 17, wherein the peripheral circuit is configured to:
  based on the program verification information, the first bit line forced information, and the second bit line forced information,
  apply a normal programming bit line voltage to a normal programming cell and apply an inhibit bit line voltage to an inhibit cell,
  apply the first forced programming voltage that is higher than the normal programming bit line voltage and lower than the inhibit bit line voltage to a first memory cell to be subjected to a first bit line forcing operation, and
  apply the second forced programming voltage that is higher than the first forced programming voltage and lower than the inhibit bit line voltage to a second memory cell to be subjected to a second bit line forcing operation.

19. A method of programming a memory device, comprising:
  performing a first sensing operation based on a first forced sensing voltage;
  storing a result of the first sensing operation to a second latch;
  exchanging first bit line forced information stored in the second latch and inhibit information stored in a dynamic latch after storing the result of the first sensing operation to the second latch;
  performing a second sensing operation based on a second forced sensing voltage different from the first forced sensing voltage;
  storing a result of the second sensing operation to the second latch;
  performing a third sensing operation based on a verification voltage;
  storing a result of the third sensing operation to a first latch; and
  exchanging second bit line forced information stored in the second latch and the first bit line forced information stored in the dynamic latch after storing the result of the third sensing operation to the first latch.

20. The method of claim 19, wherein the result of the first sensing operation is the first bit line forced information which indicates that a first forced cell has passed the verification of the first forced sensing voltage, the result of the second sensing operation is the second bit line forced information which indicates that a second forced cell has passed the verification of the second forced sensing voltage, and the result of the third sensing operation is a program verification information which indicates an inhibit cell that has passed the verification of the verification voltage,
  wherein the dynamic latch stores the first bit line forced information from the second latch to a capacitor coupled to a control switch.

* * * * *